United States Patent [19]
Paas et al.

[11] Patent Number: 5,877,697
[45] Date of Patent: Mar. 2, 1999

[54] SECURITY SYSTEM AND METHOD FOR DETECTING CHASSIS TAMPERING

[75] Inventors: Terrance J. Paas, Indianapolis; Ronald L. Wild, Carmel, both of Ind.

[73] Assignee: Lucent Technologies Inc., Murray Hill, N.J.

[21] Appl. No.: 900,994

[22] Filed: Jul. 25, 1997

[51] Int. Cl.⁶ .............................. H04M 11/00; H04N 7/00
[52] U.S. Cl. ......................... 340/825.34; 348/5.5; 348/6
[58] Field of Search ....................... 340/825.34; 348/5.5, 348/6–10, 734

[56] References Cited

U.S. PATENT DOCUMENTS 5,604,528  2/1997  Edwards et al. ........................ 348/5.5
5,764,729  6/1998  Black et al. ............................. 379/44

Primary Examiner—Brian Zimmerman
Assistant Examiner—Yonel Beaulieu

[57] ABSTRACT

A security system, for use with a chassis enclosing electrical circuitry and having a lid movable relative to the chassis to allow access to the electrical circuitry, including: (1) a plurality of switches, couplable to the electrical circuitry, that are configured to store a security code readable by the electrical circuitry and (2) a trip mechanism, coupled to the chassis, that alters the security code stored by the plurality of switches when the lid is moved relative to the chassis, whereby the electrical circuitry may detect that the lid has been moved by detecting that the security code has been altered.

38 Claims, 4 Drawing Sheets

SECURITY SYSTEM AND METHOD FOR DETECTING CHASSIS TAMPERING

TECHNICAL FIELD OF THE INVENTION

The present invention is directed, in general, to security systems and, more specifically, to a security system and method for detecting chassis tampering.

BACKGROUND OF THE INVENTION

Many utility and entertainment services, such as cable television ("TV"), require the use of customer premises equipment ("CPE"). A service provider may use such CPE to control the services received by each customer. For example, a video interdiction unit, commonly referred to as a "cable TV box," while permitting the reception of basic services, can block the receipt of premium services, such as pay-per-view movies, unless it is programmed by the service provider to receive such services. Thus, a service provider can independently control the capability of a customer to receive only the services that the customer has subscribed to, and paid for, by selectively-configuring the CPE provided to that customer.

When a piece of CPE is not subject to a service provider's continuous control, it is possible for the CPE to be tampered with by a customer. For example, a customer may alter the operation of the CPE to allow the customer to receive services that the customer has not subscribed to or paid for. Because of this, service providers have developed and used various tamper detection methods, some of which merely allow a service provider to detect whether the CPE has been tampered with, and some which disable the CPE if an attempt is made to tamper with it.

A simple tamper detection method employs a physical seal, such as an adhesive tape, which must be detectably broken before the CPE chassis can be opened. Although this method is very inexpensive, it can only alert the service provider to potential tampering if the CPE is physically examined on a periodic basis. Thus, the use of this method is generally limited to those services that require regular field inspections independent of the need to deter and detect tampering; e.g., for use-based services, such as electricity, that require periodic meter-reading to determine service usage.

A second method used to deter tampering employs a mechanical device that destructively disables a critical component of the CPE if an attempt is made to tamper with it, thus requiring a customer that attempts to tamper with the CPE to call the service provider and request either a new CPE or servicing of the disabled device. While this method eliminates the need for a service provider to conduct periodic inspections to detect tampering, it is more costly than other alternatives due to the need for replacement of the disabled component.

A third method to deter CPE tampering employs an electrical sensor that detects when a door of a CPE chassis is opened. The electrical sensor provides a signal to circuit logic, contained within the CPE, that disables the operability of the CPE, thus requiring a customer that attempts to tamper with the CPE to call the service provider in order to restore service. This method also eliminates the need for a service provider to conduct periodic inspections to detect tampering. If a customer removes the source of electrical power to the CPE before tampering with it, and closes the chassis door before restoring electrical power thereto, however, the electrical sensor is incapable of providing a signal to the circuit logic designed to disable the device. Thus, this method cannot prevent tampering by those customers who understand how the tamper detection mechanism operates.

Accordingly, what is needed in the art is a security system and method for detecting chassis tampering that does not require period field inspections, does not require the replacement of disabled circuit components, and which cannot be circumvented by removing electrical power from the device within the CPE chassis.

SUMMARY OF THE INVENTION

In accordance with the principles of the invention, a tamper-resistant chassis, such as for customer premises equipment ("CPE"), is arranged such that electrical circuitry contained therein may be disabled in response to the alteration of a security code, such alteration being effected upon tampering with the chassis.

The present invention therefore introduces the broad concept of automatically disabling electrical circuitry within a chassis by altering a security code when the chassis is tampered with, such as by opening a lid or door of the chassis. The chassis, which is purely environmental in the broad scope of the present invention, preferably encloses the electrical circuitry and prevents tampering therewith when the chassis lid, or door, is in a closed position. The electrical circuitry preferably alters its operation when the lid is moved relative to the chassis and the security code is altered in response thereto.

More particularly, for use with a chassis enclosing electrical circuitry and having a lid movable relative to the chassis to allow access to the electrical circuitry, the present invention provides a security system, and method of operation thereof, which may be employed in a device such as a video interdiction unit. The security system includes: (1) a set of switches, couplable to the electrical circuitry, that stores a security code readable by the electrical circuitry and (2) a trip mechanism, coupled to the chassis, that alters the security code stored by the switches when the lid is moved relative to the chassis, thereby allowing the electrical circuitry to detect movement of the lid.

In one embodiment of the present invention, the switches are "rocker," i.e., pivotally-positionable, switches arranged in a dual inline package ("DIP"). Those skilled in the art are familiar with DIP switches that may be pivotally-positioned to selectively store alternative values, typically in binary form, e.g., "0" and "1." The present invention allows a set of such switches, usually arranged in a line, to store a security code.

In one embodiment of the present invention, the security code is a binary number; in a related embodiment, the binary number has at least five digits. Of course, the code may be of any length, security being enhanced as the length is increased. Assuming that each switch in the plurality of switches is a two state device, five switches can store a five digit binary code, the five digit code having 32 possible values. In the embodiment described hereinafter, sixteen switches are used to store a sixteen digit binary code, the sixteen digit code having 65,536 possible values.

In one embodiment of the present invention, the trip mechanism pivots to toggle at least one of the switches when the lid is moved relative to the chassis; alternatively, the trip mechanism may translate to toggle at least one of the switches. The trip mechanism may be spring-loaded, the spring causing the trip mechanism to toggle at least one of the switches when the lid of the chassis is opened.

In the embodiment to be illustrated and described, an apparatus and method of automatically managing movement of the trip mechanism is illustrated, the means of automatic management being a cam. The structure and operation of the cam will be described in detail. The cam may have several camming surfaces that contact the cam follower to move the trip mechanism between a cocked position and a neutral position.

In one embodiment, after the trip mechanism toggles the switches, the cam causes the trip mechanism to assume a neutral position to allow the switches to be manually toggled to restore the security code. In a related embodiment, the cam restores the trip mechanism to a cocked position when the lid is returned to a closed position.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
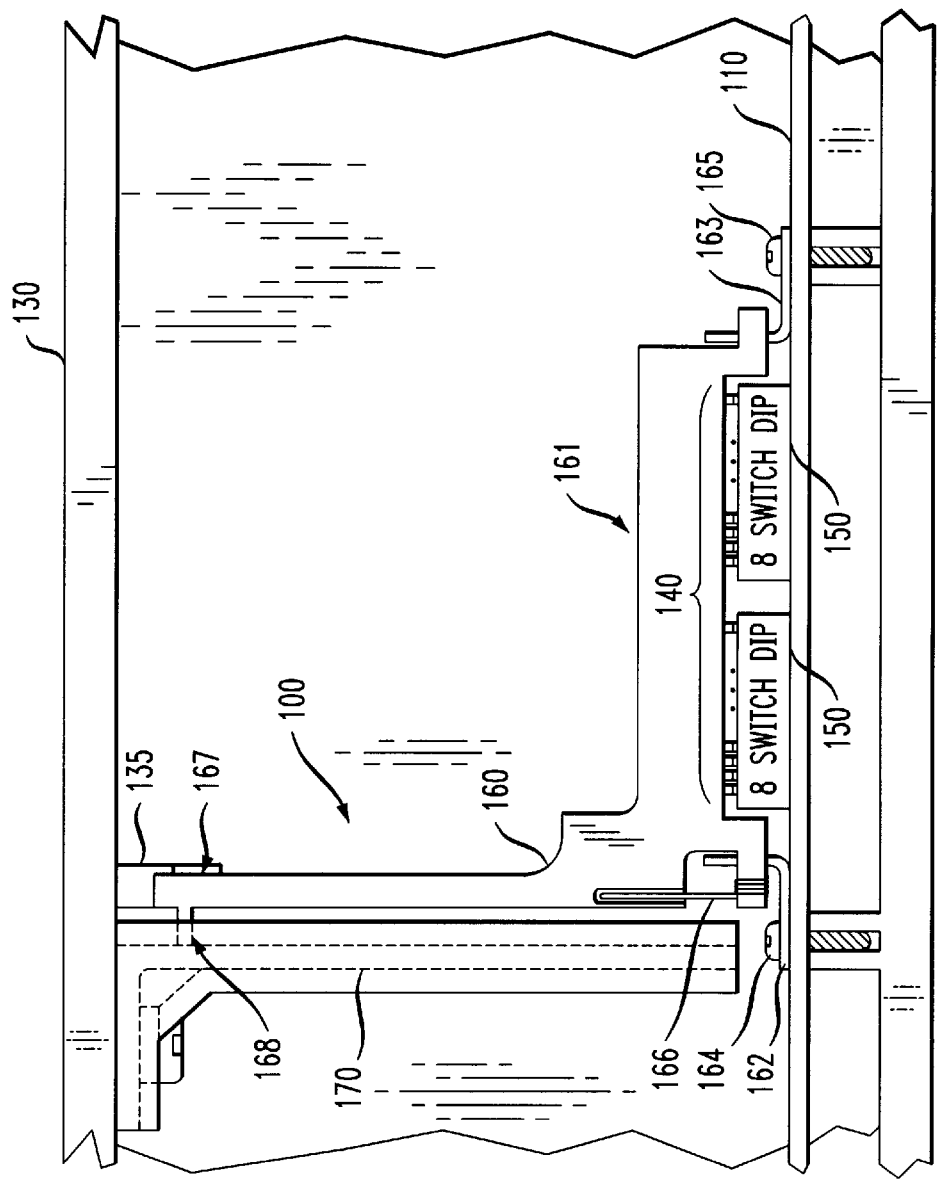
FIG. 1 illustrates a first view of an exemplary trip mechanism for altering an electronic security code according to the principles of the present invention.

Referring initially to FIG. 1, illustrated is a first view of an exemplary trip mechanism 100 for altering an electronic security code according to the principles of the present invention. Conventional customer premises equipment (CPE), which in one embodiment is a video interdiction unit, includes electrical circuitry (not shown) that is mounted to a printed wiring board (PWB) 110 and enclosed in a chassis 120. The chassis 120 includes a lid 130 that is movable relative to the chassis; as used herein, "lid" is intended to include any moveable portion of a chassis that allows access to circuitry contained therein, including, for example, a door. According to the principles of the present invention, a set of switches 140, for storing a security code, are couplable to and readable by the electrical circuitry; the trip mechanism 100 toggles at least one of the switches 140 when the lid 130 is moved relative to the chassis 120, thereby altering the security code stored by the switches 140 and thus allowing the electrical circuitry to detect the movement of the lid.

In one embodiment, the switches 140 are rocker switches, which may be arranged in one or more dual inline packages (DIP) 150. The switches 140 in each DIP 150 are pivotally-positionable to store alternative values, typically in binary form; e.g., "0" and "1". In the embodiment illustrated, the security code is a binary number having sixteen digits, each digit corresponding to one of the switches 140 (each DIP 150 having eight switches associated therewith), thereby providing a code having 65,536 possible values.

In the embodiment illustrated, the trip mechanism 100 includes a crank 160 having an arm portion 161 associated therewith for engaging at least one of the switches 140. The crank 160 is pivotally-coupled at each end of the arm portion 161 to mounts 162, 163, which are coupled to the chassis 120 by screws 164, 165, the pivot axis of the arm portion 161 illustrated as being coincident with the pivot axis of the plurality of switches 140. The crank 160 further includes a trigger portion 167 that engages a trigger rib 135 on the lid 130 to hold the crank 160 in a "cocked" position when the lid is closed. A torsion spring 166 engages the crank 160 and is operative to exert a force on the crank 160 such that when the lid 130 is opened, and trigger rib 135 disengages from crank 160, the crank rotates about its pivot axis and arm portion 161 toggles at least one of the switches 140, thereby altering the security code stored by the switches 140 and thus allowing the electrical circuitry to detect the movement of the lid 130. As will be described hereinafter, the crank 160 may further include a cam follower portion 168, proximate the trigger portion 167, that engages a cam 170 coupled to the lid 130, the cam 170 having a suitable profile, or camming surfaces, for automatically managing, or controlling, the movement of crank 160.

Figure 2:
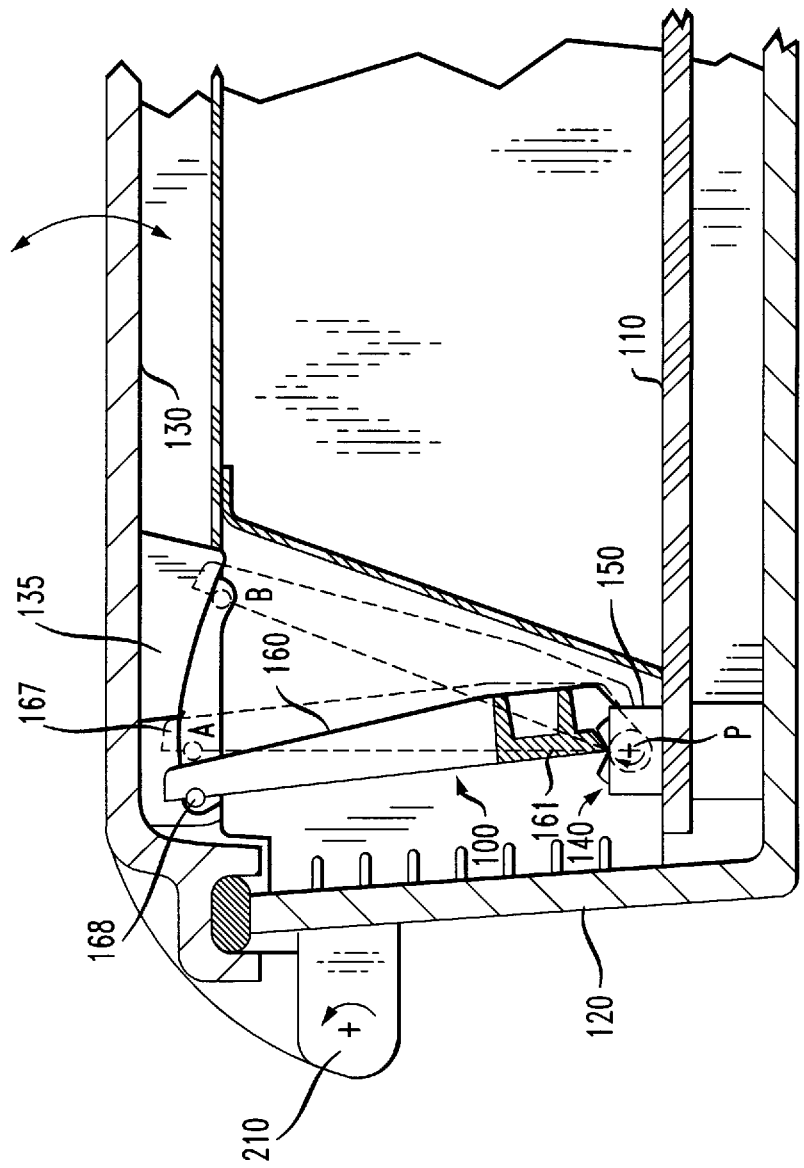
FIG. 2 illustrates a second view of the exemplary trip mechanism illustrated in FIG. 1.

Turning now to FIG. 2, illustrated is a second view of the exemplary trip mechanism 100 illustrated in FIG. 1. The lid 130 is rotatably-coupled to the chassis 120 by a hinge 210. When the lid 130 is in a closed position with respect to chassis 120, the trigger portion 167 of crank 160 engages trigger rib 135; the position of the crank 160 when the lid 130 is in a closed position is referred to as the "cocked" position (referenced as "A"), in which the switches 140 have been previously manually-positioned to store a security code. When the lid 130 is only slightly opened (i.e., rotated about the rotational axis of hinge 210), the trigger rib 135 disengages from the trigger portion 167 and crank 160 rotates about its pivot axis (referenced as "P"), due to the force exerted by torsion spring 166, such that trigger portion 167 is moved to a position referenced as "B." As the crank 160 rotates, the arm portion 161 toggles at least one of the switches 140, thereby altering the security code stored by the switches 140 and thus allowing the electrical circuitry to detect the movement of the lid 130.

Figure 3A:
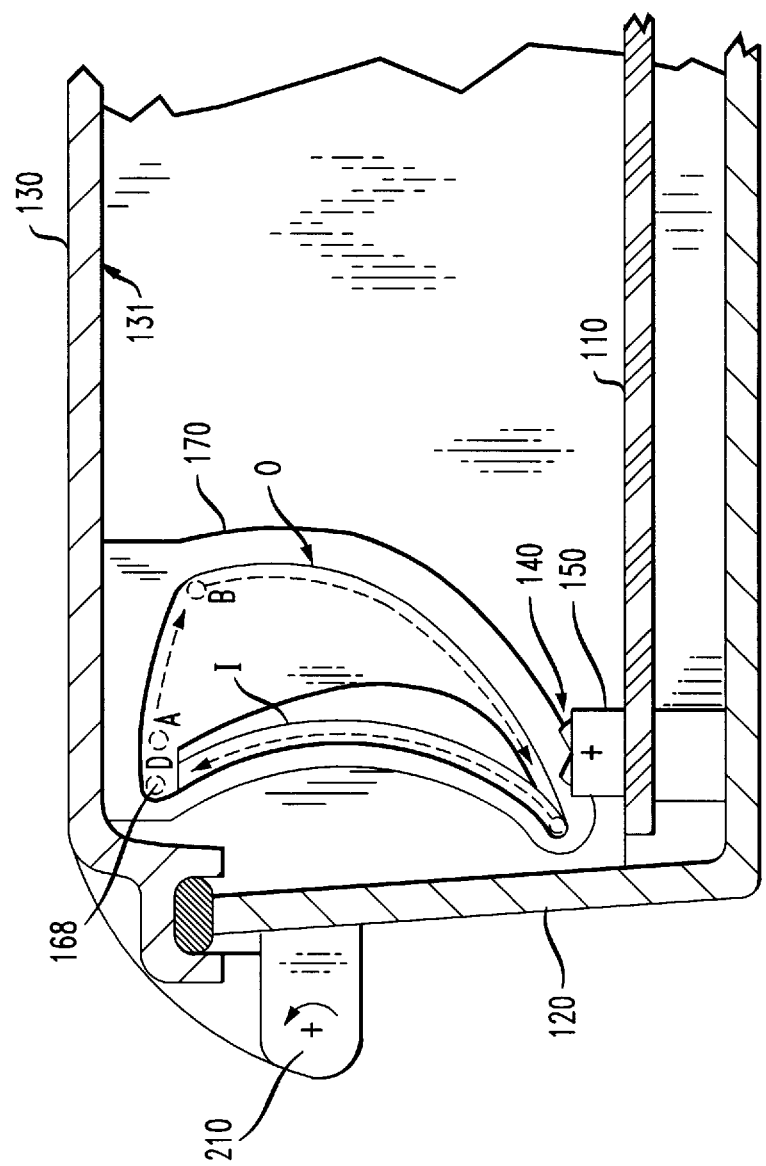
FIG. 3A illustrates a cam that may be employed with the exemplary trip mechanism illustrated in FIG. 1.

In one embodiment, as noted hereinabove, the exemplary trip mechanism 100 includes a cam 170 (referenced in FIG. 1), coupled to the lid 130, that has a profile operative to automatically control the movement of crank 160. In this embodiment, the crank 160 further includes a cam follower portion 168, proximate the trigger portion 167, that engages the cam 170 (referenced in FIGS. 1 and 2). FIG. 3A illustrates an exemplary cam 170 that may be employed in this embodiment of the exemplary trip mechanism 100.

As illustrated in FIG. 3A, cam 170 is coupled to the lid 130. The cam follower 168 of crank 160 is movably engaged with the cam 170 such that the cam follower portion 168 follows a profile of the cam from a position "A" to a position "B," from position "B" to a position "C," from position "C" to a position "D," and from position "D" back to position "A" according to the relative position of lid 130 with respect to chassis 120. To illustrate, assume that the cam follower portion 168 is initially in position "A," which corresponds to the cocked position of crank 160 (referenced in FIG. 2). As described hereinabove, the cocked position (position "A") corresponds to the lid 130 being in a closed position, with respect to chassis 120, in which position the trigger portion 167 of crank 160 engages trigger rib 135, and in which the switches 140 have been previously manually-positioned to store a security code. When the lid 130 is only slightly opened (i.e., rotated about the rotational axis of hinge 210), the trigger rib 135 disengages from the trigger portion 167 and crank 160 rotates about its pivot axis (referenced as "P" in FIG. 2) due to the force exerted by torsion spring 166 (referenced in FIG. 1). When crank 160 rotates, the cam follower portion 168 follows the cam profile to position "B," and the arm portion 161 toggles at least one of the switches 140, thereby altering the security code previously stored by the switches 140.

As the lid 130 is further opened, the force of the torsion spring 166 on crank 160 causes the cam follower portion 168 to follow an outer cam profile (referenced as "O") to position "C," at which position the lid 130 is fully opened. When the cam follower portion 168 is at position "C," the crank 160 is in a "neutral" position in which a representative of the service provider can selectively position (or "manually toggle") each of the switches 140 to restore the security code. If the switches 140 are sufficiently large in number, however, it is extremely unlikely that a person attempting to tamper with the device could determine the positions of the switches corresponding to the security code.

As the lid 130 is closed from the fully-opened position, the force of the torsion spring 166 on crank 160 causes the cam follower portion 168 to follow an inner cam profile (referenced as "I") from position "C" to position "D." When the cam follower portion 168 reaches position "D," which corresponds to the end of the inner cam profile, the force of the torsion spring 166 on crank 160 drives the cam follower portion 168 back to position "A," thereby restoring crank 160 to the "cocked" position. At position "A," the lid 130 is in a substantially closed position such that the trigger rib 135 again engages crank 160, thereby preventing the crank from moving to position "B." This prevents toggling of any of the switches 140 and maintains the security code stored therein. Only upon the next opening of lid 130 will the trigger rib 135 disengage the crank 160 and allow the arm portion 161 to toggle at least one of the switches 140, thereby altering the security code previously stored therein.

Figure 3B:
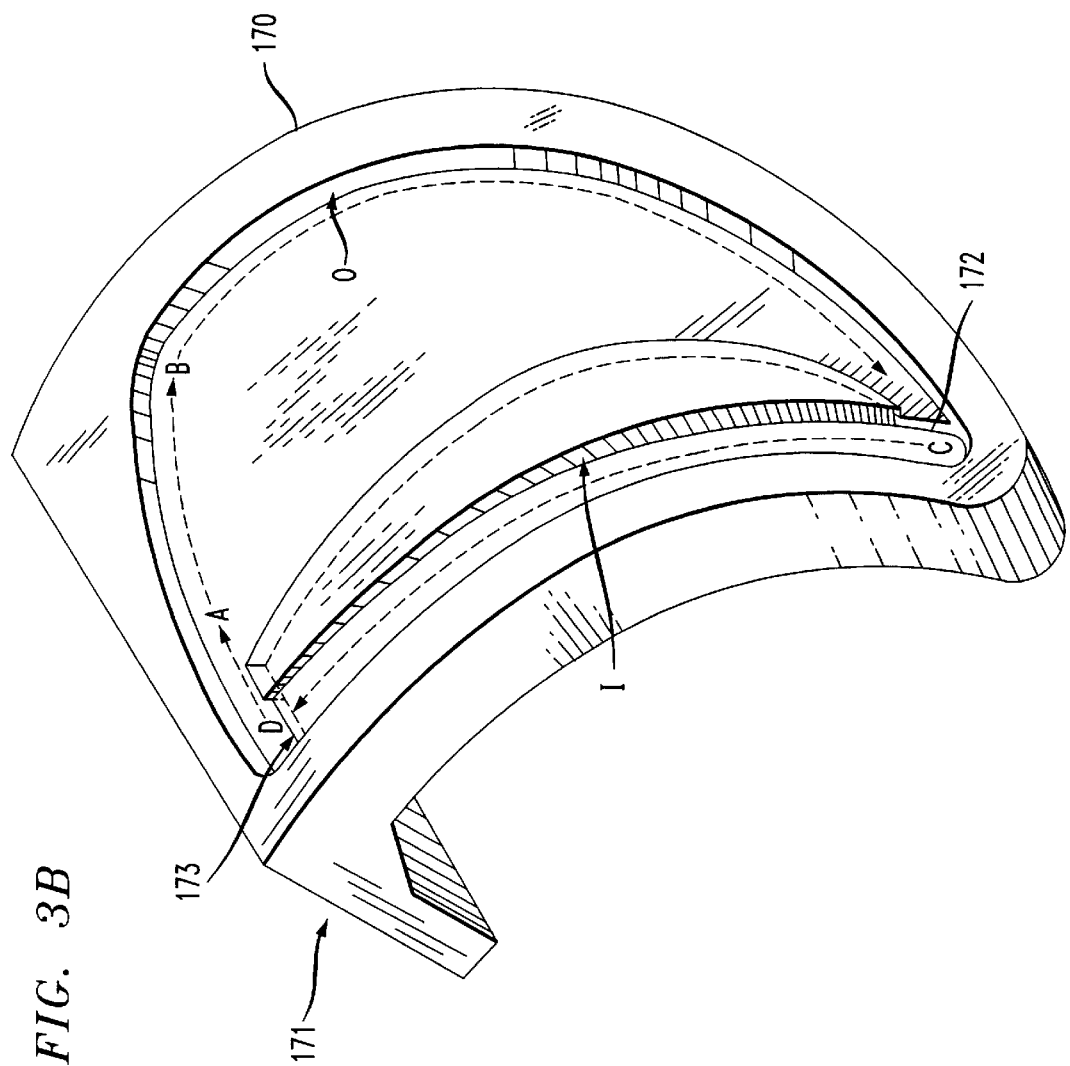
FIG. 3B illustrates an isometric view of the cam illustrated in FIG. 3A.

Turning now to FIG. 3B, illustrated is an isometric view of the exemplary cam 170. The cam 170 has a surface 171 that is mated to an inner surface 131 (referenced in FIG. 3A) of lid 130. The cam 170 has a cam profile including outer cam profile "O" and inner cam profile "I." As described hereinabove, the cam follower portion 168 of crank 160 (referenced in FIGS. 1 and 3A) is at position "A" when the crank is in a "cocked" position. When the lid 130 is only slightly opened, the cam follower portion 168 moves to position "B." As the lid 130 is further opened, the cam follower portion 168 follows the outer cam profile "O" from position "B" to position "C." In one embodiment, the cam 170 includes a first "step down" portion 172 proximate to position "C." The first "step down" portion 172 prevents the cam follower portion 168 from returning along the path from position "C" to position "B" when the lid 130 is moved from a fully-opened position (corresponding to position "C") to a closed position. When the lid 130 is moved from the fully-opened position towards the closed position, the cam follower portion 168 follows the inner cam profile "I" from position "C" to position "D," at which position the lid 130 is in a substantially closed position. In one embodiment, the cam 170 includes a second "step down" portion 173 proximate to position "D." The second "step down" portion 173 prevents the cam follower portion 168 from returning along the path from position "D" to position "C" if an attempt is made to open the lid 130 once the cam follower portion 168 has reached position "D." Once the cam follower portion 168 reaches position "D," the force of the torsion spring 166 on crank 160 (referenced in FIG. 1) drives the cam follower portion 168 back to position "A", thereby restoring crank 160 to the "cocked" position.

Although the present invention has been described in detail, those skilled in the art should understand that they can make various changes, substitutions and alterations herein without departing from the spirit and scope of the invention in its broadest form, and that they can readily use the disclosed conception and specific embodiment as a basis for designing or modifying other structures for carrying out the same purposes of the present invention. Those skilled in the art should also realize that the scope of the claims that follow are intended to encompass such equivalent constructions.

What is claimed is:

1. A security system for use with a chassis enclosing electrical circuitry and having a lid movable relative to said chassis to allow access to said electrical circuitry, said security system comprising:

a plurality of switches, couplable to said electrical circuitry, said switches configurable to store a security code readable by said electrical circuitry; and a trip mechanism, coupled to said chassis, that alters said security code stored by said plurality of switches when said lid is moved relative to said chassis, said electrical circuitry detecting that said lid has been moved by detecting that said security code has been altered.

2. The security system as recited in claim 1 wherein said trip mechanism alters said security code stored by said plurality of switches by toggling at least one of said plurality of switches when said lid is moved relative to said chassis.

3. The security system as recited in claim 1 wherein said plurality of switches are rocker switches.

4. The security system as recited in claim 3 wherein said rocker switches are arranged in a dual inline package (DIP).

5. The security system as recited in claim 1 wherein said security code is a binary number.

6. The security system as recited in claim 5 wherein said binary number has at least five digits.

7. The security system as recited in claim 2 wherein said trip mechanism pivots to toggle said plurality of switches when said lid is moved relative to said chassis.

8. The security system as recited in claim 2 further comprising a cam, coupled to said trip mechanism, that, after said trip mechanism toggles said at least one of said plurality of switches, causes said trip mechanism to assume a neutral position in which said plurality of switches may be manually toggled to restore said security code.

9. The security system as recited in claim 1 further comprising a cam, coupled to said trip mechanism, that causes said trip mechanism to assume a cocked position when said lid is in a closed position, said cam triggering said trip mechanism when said lid is moved from said closed position.

10. The security system as recited in claim 1 wherein said trip mechanism comprises a cam follower and said security system further comprises a cam having a plurality of camming surfaces thereon that receive said cam follower to move said trip mechanism between a cocked position and a neutral position.

11. A tamper detection method for use with a chassis enclosing electrical circuitry and having a lid movable relative to said chassis to allow access to said electrical circuitry, said tamper detection method comprising the steps of:

storing a security code in a plurality of switches coupled to said electrical circuitry;

altering said security code stored by said plurality of switches when said lid is moved relative to said chassis; and detecting said altered secured code with said electrical circuitry, said electrical circuitry thereby detecting when said lid is moved relative to said chassis.

12. The method as recited in claim 11 wherein said step of altering comprises the step of toggling at least one of said plurality of switches when said lid is moved relative to said chassis.

13. The method as recited in claim 11 wherein said step of altering comprises the step of mechanically toggling rocker switches.

14. The method as recited in claim 13 wherein said rocker switches are arranged in a dual inline package (DIP).

15. The method as recited in claim 11 wherein said security code is a binary number.

16. The method as recited in claim 15 wherein said binary number has at least five digits.

17. The method as recited in claim 11 wherein said step of altering comprises the step of pivoting a trip mechanism to toggle said plurality of switches when said lid is moved relative to said chassis.

18. The method as recited in claim 17 further comprising the step of causing said trip mechanism to assume a neutral position in which said plurality of switches may be manually toggled to restore said security code.

19. The method as recited in claim 17 further comprising the step of automatically restoring said trip mechanism to a cocked position when said lid is returned to a closed position.

20. A video interdiction unit, comprising:

a chassis having a lid movable relative thereto;

video interdiction circuitry enclosed within said chassis; and a security system, including:
a plurality of switches, coupled to said video interdiction circuitry, said switches configurable to store a security code readable by said video interdiction circuitry; and
a trip mechanism, coupled to said chassis, that alters said security code stored by said plurality of switches when said lid is moved relative to said chassis, said electrical circuitry detecting that said lid has been moved by detecting that said security code has been altered.

21. The video interdiction unit as recited in claim 20 wherein said trip mechanism alters said security code stored by said plurality of switches by toggling at least one of said plurality of switches when said lid is moved relative to said chassis.

22. The video interdiction unit as recited in claim 20 wherein said plurality of switches are rocker switches.

23. The video interdiction unit as recited in claim 22 wherein said rocker switches are arranged in a dual inline package (DIP).

24. The video interdiction unit as recited in claim 20 wherein said security code is a binary number.

25. The video interdiction unit as recited in claim 24 wherein said binary number has at least five digits.

26. The video interdiction unit as recited in claim 21 wherein said trip mechanism pivots to toggle said at least one of said plurality of switches when said lid is moved relative to said chassis.

27. The video interdiction unit as recited in claim 21 further comprising a cam, coupled to said trip mechanism, that, after said trip mechanism toggles said at least one of said plurality of switches, causes said trip mechanism to assume a neutral position in which said plurality of switches may be manually toggled to restore said security code.

28. The video interdiction unit as recited in claim 20 further comprising a cam, coupled to said trip mechanism, that causes said trip mechanism to assume a cocked position when said lid is in a closed position, said cam triggering said trip mechanism when said lid is moved from said closed position.

29. The video interdiction unit as recited in claim 20 wherein said trip mechanism comprises a cam follower and said security system further comprises a cam having a plurality of camming surfaces thereon that receive said cam follower to move said trip mechanism between a cocked position and a neutral position.

30. A tamper detection system for use with a chassis enclosing electrical circuitry and having a lid movable relative to said chassis to allow access to said electrical circuitry, said tamper detection system comprising:

means for storing a security code in a plurality of switches coupled to said electrical circuitry;

means for altering said security code stored by said plurality of switches when said lid is moved relative to said chassis; and means for detecting said altered secured code with said electrical circuitry, said electrical circuitry thereby detecting when said lid is moved relative to said chassis.

31. The system as recited in claim 30 wherein said means for altering said security code comprises a means for toggling at least one of said plurality of switches when said lid is moved relative to said chassis.

32. The system as recited in claim 30 wherein said means for altering said security code comprises a means for mechanically toggling rocker switches.

33. The system as recited in claim 32 wherein said rocker switches are arranged in a dual inline package (DIP).

34. The system as recited in claim 30 wherein said security code is a binary number.

35. The system as recited in claim 34 wherein said binary number has at least five digits.

36. The system as recited in claim 30 wherein said means for altering said security code comprises means for pivoting a trip mechanism to toggle said plurality of switches when said lid is moved relative to said chassis.

37. The system as recited in claim 36 further comprising means for causing said trip mechanism to assume a neutral position in which said plurality of switches may be manually toggled to restore said security code.

38. The system as recited in claim 36 further comprising means for automatically restoring said trip mechanism to a cocked position when said lid is returned to a closed position.

* * * * *